United States Patent
Moore (10) Patent No.: US 6,836,223 B2
(45) Date of Patent: Dec. 28, 2004

(54) ULTRA-WIDEBAND PULSE MODULATION SYSTEM AND METHOD

(75) Inventor: Steven A. Moore, Escondido, CA (US)

(73) Assignee: Pulse-LINK, Inc., Carlsbad, CA (US)

( * ) Notice: Subject to any disclaimer, the term of this patent is extended or adjusted under 35 U.S.C. 154(b) by 30 days.

(21) Appl. No.: 10/747,608

(22) Filed: Dec. 29, 2003

(65) Prior Publication Data

US 2004/0140918 A1 Jul. 22, 2004

Related U.S. Application Data

(62) Division of application No. 10/294,021, filed on Nov. 12, 2002.

(51) Int. Cl.[7] .................................................. H03M 1/22
(52) U.S. Cl. ............................................. 341/15; 341/72
(58) Field of Search ............................. 341/15, 72, 59, 341/50, 51, 53, 155; 375/365, 278, 238

(56) References Cited

U.S. PATENT DOCUMENTS

| 3,093,798 | A | * | 6/1963 | Jacobsen ..................... 327/183 |
| 3,399,350 | A | * | 8/1968 | De Lisle ...................... 375/365 |
| 3,668,639 | A | | 6/1972 | Harmuth |
| 3,678,204 | A | | 7/1972 | Harmuth |
| 3,728,632 | A | | 4/1973 | Ross |
| 4,427,982 | A | | 1/1984 | Caprio |
| 4,641,317 | A | | 2/1987 | Fullerton |
| 4,743,906 | A | | 5/1988 | Fullerton |
| 4,756,025 | A | * | 7/1988 | Munz et al. ................. 398/154 |
| 4,813,057 | A | | 3/1989 | Fullerton |
| 4,815,106 | A | | 3/1989 | Propp et al. |
| 4,864,589 | A | | 9/1989 | Endo |
| 4,965,575 | A | * | 10/1990 | Wash ........................... 341/72 |
| 4,979,186 | A | | 12/1990 | Fullerton |
| 5,051,720 | A | | 9/1991 | Kittirutsunetorn |
| 5,146,616 | A | | 9/1992 | Tang et al. |
| 5,166,890 | A | | 11/1992 | Smischny |
| 5,363,108 | A | | 11/1994 | Fullerton |
| 5,376,888 | A | * | 12/1994 | Hook ........................... 324/643 |
| 5,491,463 | A | | 2/1996 | Sargeant et al. |
| 5,519,400 | A | | 5/1996 | McEwan |
| 5,526,349 | A | | 6/1996 | Diaz et al. |

(List continued on next page.)

FOREIGN PATENT DOCUMENTS

| WO | WO 01/39451 A1 | 5/2001 |
| WO | WO 01/93434 A2 | 12/2001 |
| WO | WO 02/31986 A2 | 4/2002 |

OTHER PUBLICATIONS

Leeper, David G., "Wireless Data Blaster," Scientific American, May 2002, pp. 64–69, Scientific American, Inc., United States of America.

*Primary Examiner*—Jean Bruner Jeanglaude
(74) *Attorney, Agent, or Firm*—Peter R. Martinez (57) ABSTRACT

An ultra-wideband pulse modulation apparatus, system and method is provided. The pulse modulation method increases the available bandwidth in an ultra-wideband, or impulse radio communications system. A set of different pulse transmission, or emission rates are employed to represent different groups of binary digits. The modulation and pulse transmission method enables the simultaneous coexistence of the ultra-wideband pulses with conventional carrier-wave signals. This method may be used in wireless and wired communication networks such as CATV networks. This Abstract is provided for the sole purpose of complying with the Abstract requirement rules that allow a reader to guickly ascertain the subject matter of the disclosure contained herein. This Abstract is submitted with the explicit understanding that it will not be used to interpret or to limit the scope or the meaning of the claims.

22 Claims, 5 Drawing Sheets

U.S. PATENT DOCUMENTS

| | | | |
|---|---|---|---|
| 5,554,968 A | | 9/1996 | Lee |
| 5,586,145 A | | 12/1996 | Morgan et al. |
| 5,623,518 A | * | 4/1997 | Pfiffner .................. 375/278 |
| 5,644,601 A | * | 7/1997 | Kawaguchi ............... 375/295 |
| 5,677,927 A | | 10/1997 | Fullerton et al. |
| 5,687,169 A | | 11/1997 | Fullerton |
| 5,729,607 A | | 3/1998 | DeFries et al. |
| 5,745,837 A | | 4/1998 | Fuhrmann |
| 5,748,119 A | * | 5/1998 | Ko .......................... 341/59 |
| 5,774,077 A | * | 6/1998 | Schouhamer Immink .... 341/50 |
| 5,774,526 A | | 6/1998 | Propp et al. |
| 5,862,141 A | | 1/1999 | Trotter |
| 5,864,284 A | | 1/1999 | Sanderson |
| 5,937,342 A | | 8/1999 | Kline |
| 5,940,387 A | | 8/1999 | Humpleman |
| 5,982,276 A | | 11/1999 | Stewart |
| 6,020,839 A | * | 2/2000 | Thornton .................. 341/155 |
| 6,026,125 A | | 2/2000 | Larrick, Jr. et al. |
| 6,031,862 A | | 2/2000 | Fullerton et al. |
| 6,037,884 A | * | 3/2000 | Thornton .................. 341/53 |
| 6,040,759 A | | 3/2000 | Sanderson |
| 6,041,051 A | | 3/2000 | Doshi et al. |
| 6,163,873 A | | 12/2000 | Murano |
| 6,178,217 B1 | | 1/2001 | Defries et al. |
| 6,281,784 B1 | | 8/2001 | Redgate et al. |
| 6,373,377 B1 | | 4/2002 | Sacca et al. |
| 6,678,321 B1 | * | 1/2004 | Graham et al. ............. 375/238 |
| 2001/0033610 A1 | | 10/2001 | Chastain |
| 2002/0075972 A1 | | 6/2002 | Richards et al. |
| 2002/0076193 A1 | | 6/2002 | Melick et al. |

* cited by examiner

ULTRA-WIDEBAND PULSE MODULATION SYSTEM AND METHOD

This application is a divisional of co-pending U.S. non-provisional application Ser. No. 10/294,021, filed Nov. 12, 2002, which is still pending, entitled "ULTRA-WIDEBAND PULSE MODULATION SYSTEM AND METHOD."

FIELD OF THE INVENTION

The present invention generally relates to ultra-wideband communications. More particularly, the invention concerns a method of modulating ultra-wideband pulses for wire and wireless communications.

BACKGROUND OF THE INVENTION

The Information Age is upon us. Access to vast quantities of information through a variety of different communication systems are changing the way people work, entertain themselves, and communicate with each other. For example, as a result of increased telecommunications competition mapped out by Congress in the 1996 Telecommunications Reform Act, traditional cable television program providers have evolved into full-service providers of advanced video, voice and data services for homes and businesses. A number of competing cable companies now offer cable systems that deliver all of the just-described services via a single broadband network.

These services have increased the need for bandwidth, which is the amount of data transmitted or received per unit time. More bandwidth has become increasingly important, as the size of data transmissions has continually grown. Applications such as in-home movies-on-demand and video teleconferencing demand high data transmission rates. Another example is interactive video in homes and offices. The emergence of the Internet saw the largest impact on the telecommunication networks by bringing about the convergence of voice and Internet data traffic. Consequently, carriers and service providers are overhauling the entire network infrastructure—including switches, routers, backbone, and the last mile (i.e., the local loop)—in an effort to provide more bandwidth.

Other industries are also placing bandwidth demands on Internet service providers, and other data providers. For example, hospitals transmit images of X-rays and CAT scans to remotely located physicians. Such transmissions require significant bandwidth to transmit the large data files in a reasonable amount of time. The need for more bandwidth is evidenced by user complaints of slow Internet access and dropped data links that are symptomatic of network overload.

Therefore, there exists a need for a method to increase the bandwidth of wired network or communication system, as well as a wireless network or communication system.

SUMMARY OF THE INVENTION

The present invention provides a method of modulating an ultra-wideband signal. The pulse can be transmitted and received wirelessly, or through any wire medium, whether the medium is twisted-pair wire, coaxial cable, fiber optic cable, or other types of wire media.

One embodiment of the present invention provides a pulse modulation method that increases the available bandwidth of a communication system by enabling the simultaneous transmission of conventional carrier-wave signals and ultra-wideband pulses. The method includes modulating data on the transmission rate of the ultra-wideband pulses. That is, the transmission rate of the ultra-wideband pulses carries the data. The modulation and pulse transmission method of the present invention enables the simultaneous coexistence of the ultra-wideband pulses with conventional carrier-wave signals. The present invention may be used in wireless and wired communication networks such as hybrid fiber-coax networks.

Another embodiment of the present invention comprises probability-based manipulation of data prior to its transmission. Lower probability data groups are assigned to lower pulse transmission rates. This increases the average data transmission rate because data transmission rates increase with higher pulse transmission rates.

One feature of the present invention is that the transmitted ultra-wideband pulses have a spectral power density that does not cause interference with other communication signals.

Thus, the ultra-wideband pulses transmitted according to the methods of the present invention enable a significant increase in the bandwidth, or data rates of a communication system.

These and other features and advantages of the present invention will be appreciated from review of the following detailed description of the invention, along with the accompanying figures in which like reference numerals refer to like parts throughout.

It will be recognized that some or all of the Figures are schematic representations for purposes of illustration and do not necessarily depict the actual relative sizes or locations of the elements shown.

DETAILED DESCRIPTION OF THE INVENTION

In the following paragraphs, the present invention will be described in detail by way of example with reference to the attached drawings. Throughout this description, the preferred embodiment and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Generally, a traditional cable television provider, a community antenna television provider, a community access television provider, a cable television provider, a hybrid fiber-coax television provider, an Internet service provider, or any other provider of television, audio, voice and/or Internet data receives broadcast signals at a central station, either from terrestrial cables, and/or from one or more antennas that receive signals from a communications satellite.

The broadcast signals are then distributed, usually by coaxial and/or fiber optic cable, from the central station to nodes located in business or residential areas.

For example, community access television provider (CATV) networks are currently deployed in several different topologies and configurations. The most common configurations found today are analog signals transmitted over coaxial cable and Hybrid Fiber-Coax Systems (HFCS) that employ both fiber optic and coaxial cables. The analog coax systems are typically characterized as pure analog systems. Pure analog CATV systems are characterized by their use of established NTSC/PAL (National Television Standards Committee/Phase Alternation Line) modulation onto a frequency carrier at 6 or 8 MHz intervals.

HFCS is a combination analog-digital topology employing both coaxial (analog) and fiber optic (digital) media that typically supports digitally modulated/encoded television channels above channel 78. According to ANSI/EIA-542-1997, in the United States, the analog channels are modulated in 6 MHz allocations on channels 2 to 78 using frequencies from 55 to 547 MHz. When using HFCS, digital channels typically start at channel 79 and go as high as 136 and occupy a frequency range from 553 to 865 MHz. In some extended HFCS systems, channel assignments can go as high as channel 158 or 997 MHz. The current ANSI/EIA-542-1997 standard only defines and assigns channels to these limits. The actual wire/cable media itself is generally capable of transmitting frequencies up to 3 GHz.

In both CATV and HFCS systems, typically the satellite downlink enters the cable company's head-end and the video, and/or other data streams are de-multiplexed out. Individual video data streams (either NTSC, MPEG, or any other suitable protocol) are extracted from the satellite downlink stream and routed to modulators specific for individual television channels. The outputs from each modulator are then combined into one broadband signal. From this point the combined channels are amplified and sent out, either by coaxial or fiber optic cable, to the customers.

In a HFCS, before the combined broadband signal leaves the head-end the broadband signal is modulated onto a fiber optic cable for distribution into the field, such as residential neighborhoods, or business districts. Modulation of the broadband signal is typically accomplished in one of two ways. In the first method the entire broadband signal is sampled and digitized using a high speed Analog to Digital Converter (ADC). To perform reliable digital sampling, the data must be sampled at a rate at least twice the highest frequency component to meet Nyquist minimum sampling requirements. To provide a higher quality data stream, the signal should be sampled at 2.5 to 4 times the highest frequency, which entails sample rates of approximately 2 to 4 GHz. A parallel to serial converter then shifts the parallel output data of the ADC into a serial format. The serial data then drives a laser diode for transmission over the fiber optic cable. The second method is broadband block conversion where the entire spectrum of the broadband signal is modulated onto the fiber optic cable.

Designated access nodes are located in neighborhoods, business districts and other areas. The access nodes contain a high speed Digital to Analog Converter (DAC) and a de-serializer. A fiber optic receiver detects the laser-modulated signal at the access node. A parallel to serial converter de-serializes the data and it is feed to the high speed DAC. The data then leaves the access node on standard 75 ohm, RG-6 or RG-8 or other suitable coax cable and is distributed to the customer's premises. Thus, at the access node, the broadband signal is extracted from the fiber optic cable and transferred to a coaxial cable that connects to individual homes, apartments, businesses, universities, and other customers. Support of multiple customers is generally accomplished by the use of distribution boxes in the field, for example, on telephone poles or at ground level. However, as the signal is continuously split at the distribution boxes, the received bandwidth is reduced and the quality of the signal is diminished, thereby diminishing the video, audio, and other data quality.

The digital channels that generally reside on CATV channels 79 and higher are fundamentally different than the analog channels that generally reside on channels 2 through 78. The analog channels are comprised of modulated frequency carriers. The digital channels, which generally use the 6 MHz allocation system, are digitally modulated using Quadrature Amplitude Modulation (QAM). QAM is a method of combining two amplitude modulated signals into a single channel, thereby doubling the effective bandwidth. In a QAM signal, there are two carriers, each having the same frequency but differing in phase by 90 degrees. The two modulated carriers are combined for transmission, and separated after transmission. QAM 16 transmits 16 bits per signal, QAM 32, 64, and 256 each transmit 32, 54 and 256 bits per signal, respectively. QAM was developed to support additional video streams encoded with MPEG video compression. Conventional CATV and HFCS networks may employ QAM levels up to QAM 64 to enable up to 8 independent, substantially simultaneous MPEG video streams to be transmitted.

At the customer's location, the coaxial cable is connected to either a set-top box or directly to a television. The receiving device then de-multiplexes and de-modulates the video, audio, voice, Internet or other data. Although a television can directly receive the analog signal, a set-top box is generally required for reception of the digitally encoded channels residing on CATV channels 79 and higher.

The above-described networks, and other networks and communication systems that employ wire media, such as twisted-pair or coaxial cable, suffer from performance limitations caused by signal interference, ambient noise, and spurious noise. In these conventional wire media systems, these limitations affect the available system bandwidth, distance, and carrying capacity of the system, because the noise floor and signal interference in the wire media rapidly overcome the signal transmitted. Therefore, noise within the wire media significantly limits the available bandwidth of any wire system or network.

Generally, the conventional wisdom for overcoming this limitation is to boost the power (i.e., increase the voltage of the signal) at the transmitter to boost the voltage level of the signal relative to the noise at the receiver. Without boosting the power at the transmitter, the receiver is unable to separate the noise from the desired signal. Thus, the overall performance of wire media systems is still significantly limited by the accompanying noise that is inherent in wire media.

Increasing the available bandwidth of an established wire media network, while coexisting with the conventional data signals transmitted through the network, represents an opportunity to leverage the existing wire media network infrastructure to enable the delivery of greater functionality. Several methods and techniques have been proposed, but they are generally computationally intense, hence costly.

The present invention may be employed in any type of network that uses wire media, in whole, or in part. That is, a network may use both wire media, such as coaxial cable, and wireless devices, such as satellites. As defined herein, a network is a group of points or nodes connected by communication paths. The communication paths may be connected by wires, or they may be wirelessly connected. A network as defined herein can interconnect with other networks and contain subnetworks. A network as defined herein can be characterized in terms of a spatial distance, for example, such as a local area network (LAN), a personal area network (PAN), a metropolitan area network (MAN), and a wide area network (WAN), among others. A network as defined herein can also be characterized by the type of data transmission technology in use on it, for example, a TCP/IP network, and a Systems Network Architecture network, among others. A network as defined herein can also be characterized by whether it carries voice, data, or both kinds of signals. A network as defined herein can also be characterized by who can use the network, for example, a public switched telephone network (PSTN), other types of public networks, and a private network (such as within a single room or home), among others. A network as defined herein can also be characterized by the usual nature of its connections, for example, a dial-up network, a switched network, a dedicated network, and a nonswitched network, among others. A network as defined herein can also be characterized by the types of physical links that it employs, for example, optical fiber, coaxial cable, a mix of both, unshielded twisted pair, and shielded twisted pair, among others.

In addition, the present invention may be employed in any type of wireless network, such as a wireless PAN, LAN, MAN or WAN. The present invention employs a "carrier free" architecture, which does not require the use of high frequency carrier generation hardware, carrier modulation hardware, stabilizers, frequency and phase discrimination hardware or other devices employed in conventional frequency domain communication systems. The present invention dramatically increases the bandwidth of conventional networks that employ wire media, but can be inexpensively deployed without extensive modification to the existing wire media network.

The present invention provides increased bandwidth by injecting, or otherwise super-imposing an ultra-wideband (UWB) signal into the existing data signal and subsequently recovers the UWB signal at an end node, set-top box, subscriber gateway, or other suitable location. Ultra-wideband, or impulse radio, employs pulses of electromagnetic energy that are emitted at nanosecond or picosecond intervals (generally tens of picoseconds to a few nanoseconds in duration). For this reason, ultra-wideband is often called "impulse radio." Because the excitation pulse is not a modulated waveform, UWB has also been termed "carrier-free" in that no apparent carrier frequency is evident in the radio frequency (RF) spectrum. That is, the UWB pulses are transmitted without modulation onto a sine wave carrier frequency, in contrast with conventional radio frequency technology. Ultra-wideband generally requires neither an assigned frequency nor a power amplifier.

Conventional radio frequency technology employs continuous sine waves that are transmitted with data embedded in the modulation of the sine waves' amplitude or frequency. For example, a conventional cellular phone must operate at a particular frequency band of a particular width in the total frequency spectrum. Specifically, in the United States, the Federal Communications Commission has allocated cellular phone communications in the 800 to 900 MHz band. Cellular phone operators use 25 MHz of the allocated band to transmit cellular phone signals, and another 25 MHz of the allocated band to receive cellular phone signals.

Figure 1:
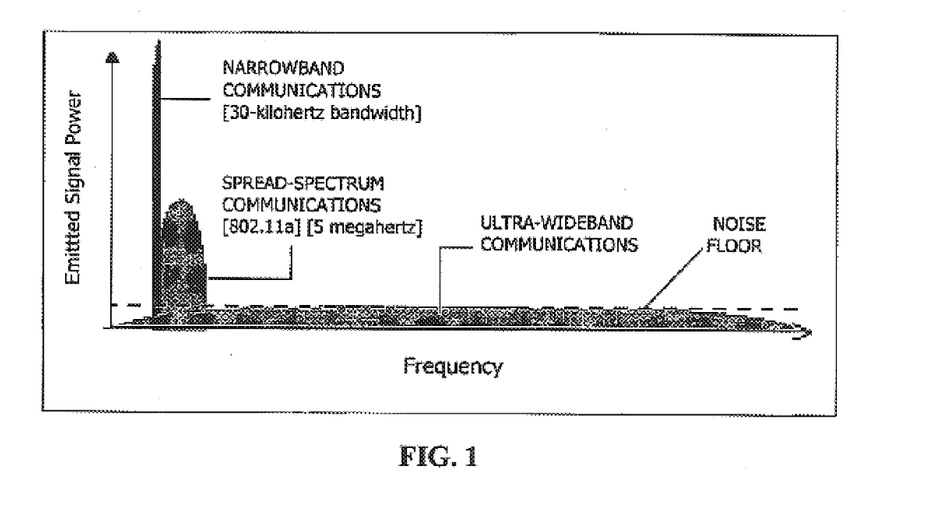
FIG. 1 is an illustration of different communication methods.

Another example of a conventional radio frequency technology is illustrated in FIG. 1. 802.11a, a wireless local area network (LAN) protocol, transmits radio frequency signals at a 5 GHz center frequency, with a radio frequency spread of about 5 MHz.

Figure 2:
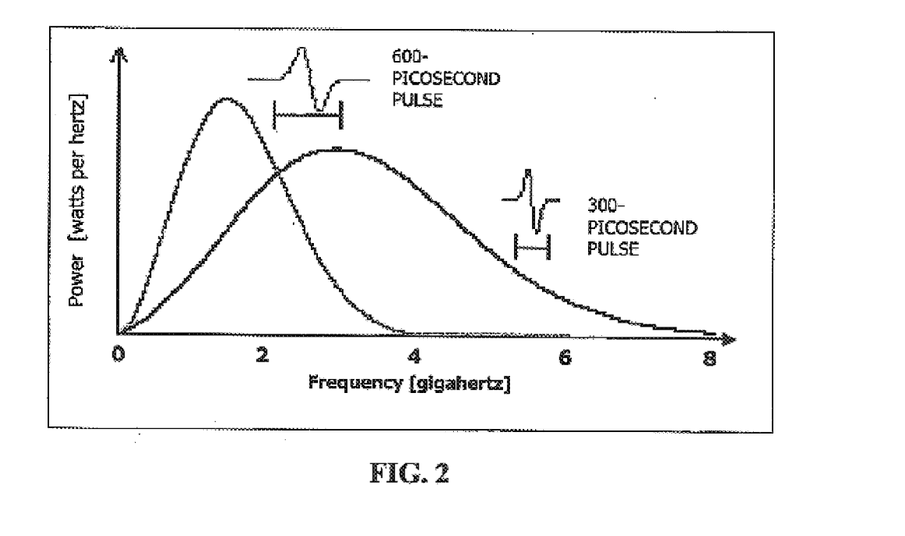
FIG. 2 is an illustration of two ultra-wideband pulses.

In contrast, a UWB pulse may have a 1.8 GHz center frequency, with a frequency spread of approximately 4 GHz, as shown in FIG. 2, which illustrates two typical UWB pulses. FIG. 2 illustrates that the narrower the UWB pulse in time, the higher its center frequency and the broader the spread of its frequency spectrum. This is because frequency is inversely proportional to the time duration of the pulse. A 600 picosecond UWB pulse will have about a 1.8 GHz center frequency, with a frequency spread of approximately 4 GHz. And a 300 picosecond UWB pulse will have about a 3 GHz center frequency, with a frequency spread of approximately 8 GHz. Thus, UWB pulses generally do not operate within a specific frequency, as shown in FIG. 1. And because UWB pulses are spread across an extremely wide frequency range, UWB communication systems allow communications at very high data rates, such as 100 megabits per second or greater.

Further details of UWB technology are disclosed in U.S. Pat. 3,728,632 (in the name of Gerald F. Ross, and titled: Transmission and Reception System for Generating and Receiving Base-Band Duration Pulse Signals without Distortion for Short Base-Band Pulse Communication System), which is referred to and incorporated herein in its entirety by this reference.

Also, because the UWB pulse is spread across an extremely wide frequency range, the power sampled at a single, or specific frequency is very low. For example, a UWB one-watt signal of one nano-second duration spreads the one-watt over the entire frequency occupied by the pulse. At any single frequency, such as at the carrier frequency of a CATV provider, the UWB pulse power present is one nano-watt (for a frequency band of 1 GHz). This is well within the noise floor of any wire media system and therefore does not interfere with the demodulation and recovery of the original CATV signals. Generally, the multiplicity of UWB pulses are transmitted at relatively low power (when sampled at a single, or specific frequency), for example, at less than −30 power decibels to −60 power decibels, which minimizes interference with conventional radio frequencies. However, UWB pulses transmitted through most wire media will not interfere with wireless radio frequency transmissions. Therefore, the power (sampled at a single frequency) of UWB pulses transmitted though wire media may range from about +30 dBm to about −140 dBm.

Wire media communication systems suffer from performance limitations caused by signal interference, ambient noise, and spurious noise. These limitations affect the available bandwidth, distance, and carrying capacity of the wire media system. With wired communication systems, the noise floor and signal interference in the wire media rapidly overcome the transmitted carrier signal. This noise on the wire media is a significant limitation to the ability of the system to increase bandwidth. UWB technology makes use of the noise floor to transmit data, without interfering with the carrier signal. Moreover, UWB transmitted through a wire medium has distinct advantages over its use in a wireless environment. In a wire environment there are no concerns with intersymbol interference, and there are no concerns relating to multi-user interference.

For example, CATV channels typically occupy 6 MHz in the US and 8 MHz in Europe. These channels are arranged in a re-occurring pattern beginning at approximately 50 MHz and dependent on the CATV system, extend upward to 550 MHz, 750 MHz, 870 MHz, 1 GHz and higher. The present invention is capable of injecting UWB pulses into the existing CATV infrastructure. These UWB signals do not interfere or degrade existing frequency domain signals. Additionally, the UWB signals can carry vast amounts of information with digital meaning in the time domain.

Figure 3:
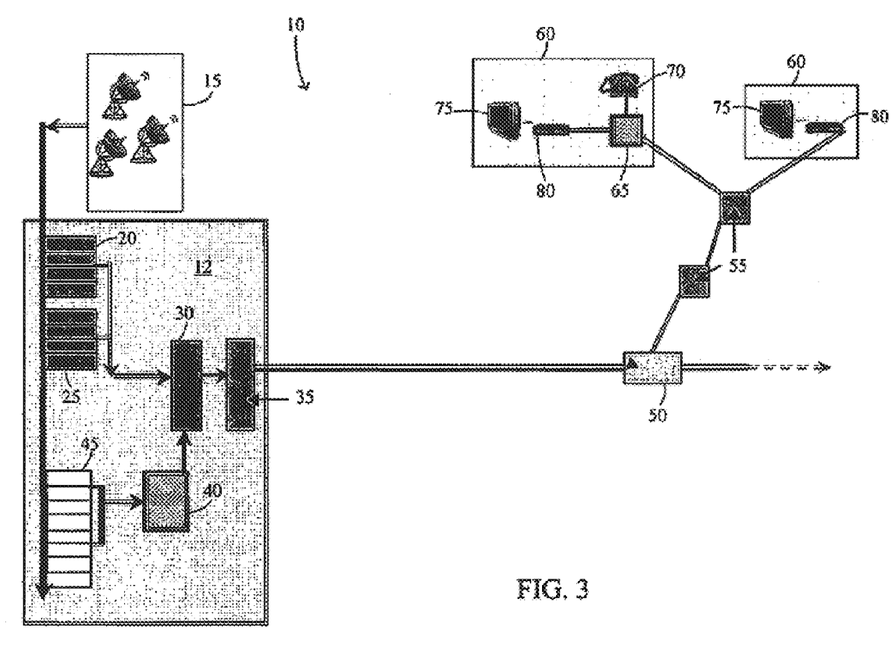
FIG. 3 is a schematic illustration of one embodiment of an ultra-wideband communication system employing a wire medium.

The present invention provides an apparatus and method to enable any wire media network to augment their available bandwidth. Preferably, this additional bandwidth is obtained by introducing UWB signals into the existing data transmission chain prior to broadcast from the system operator's head-end. As shown in FIG. 3, a CATV system 10, employing the present invention, is illustrated. An antenna and satellite farm 15 feeds signals to the head-end 12, which may include several components, such as an analog channel modulator 20, a digital channel modulator 25, a combiner 30, a fiber optic transmitter/receiver 35, and other components, as required.

A head-end 12, when constructed to include the present invention, may have a UWB signal injector/modulator 40 that may receive data from additional content and service modulators 45, which will provide new content and service because of the increased bandwidth provided by the present invention. Alternatively, the UWB signal injector/modulator may be introduced into the CATV system 10 at other suitable locations.

In like fashion, cable system operators can receive more data from individual subscribers by introducing subscriber-generated data into existing upstream channels. The present invention provides UWB communication across fiber optic and coaxial cable, twisted pair wires, or any other type of conductive wire. A wire media network will be able to both transmit and receive digital information for the purposes of telephony, high-speed data, video distribution, video conferencing, wireless base operations and other similar purposes. In addition, the present invention may also be employed in a wireless communication system.

Referring to FIG. 3, a CATV system 10 employing the present invention can transmit ultra-wideband signals over an existing network or system that includes wire media. For example, the CATV system 10 may transmit UWB signals over an existing community access television network (CATV), an optical network, a cable television network, a community antenna television network, a hybrid fiber-coax television network, an Internet service provider network, a PSTN network, a WAN, LAN, MAN, PAN, TCP/IP network, a college campus, town, city, or any other type of network as defined above, that employs wire media, in whole or in part.

Illustrated in FIG. 3, an antenna farm 15 receives audio, video and data information from one or more satellites (not shown). Additional data may be received by terrestrial cables and wires and by terrestrial wireless sources, such as a multichannel multipoint distribution service (MMDS). The data is then forwarded to the analog modulators 20 and/or to the digital modulators 25 that modulate the data into separate audio, video and data streams. The data is then forwarded to a combiner 30 that combines the multiple signals into a single output. That is, the combiner 30 receives the program signals from the analog modulators 20 and/or to the digital modulators 25 and combines them onto a single coax cable and forwards the signal to the fiber optic transmitter/receiver 35. The above-described arrangement and function of analog modulators 20 and/or to the digital modulators 25 and combiners 30 may vary with each type of wire media network.

Additional audio, video, or other data signals received from either the antenna farm 15 or from terrestrial sources such as fiber optic or coaxial cables can be routed to the new content and service modulators 45 that forward the data to the UWB signal modulator/injector 40. The UWB signal modulator/injector 40 converts the audio, video, or other data signals into a multiplicity of UWB electromagnetic pulses. One embodiment of the UWB signal modulator/injector 40 may function as a transmitter and as a receiver, to both transmit and receive UWB pulses.

The UWB signal modulator/injector 40 may include several components, including a controller, digital signal processor, an analog coder/decoder, a waveform generator, an encoder, static and dynamic memory, data storage devices, a receiver, an amplifier, an interface, an envelope detector, a timing generator producing timing signals when triggered, an envelope sampler, a threshold detector, a data detector to produce a demodulation decision based on a pulse transmission rate, a precision timing device, a data encoder to determine a pulse transmission rate, one or more devices for data access management, and associated cabling and electronics. One or more of the above-listed components may be co-located or they may be separate devices, and the UWB signal modulator/injector 40 may include some, or all of these components, other necessary components, or their equivalents. The controller may include error control, and data compression functions. The analog coder/decoder may include an analog to digital conversion function and vice versa. The data access management device or devices may include various interface functions for interfacing to wire media such as phone lines and coaxial cables. Alternative embodiments of the UWB signal modulator/injector 40 may employ hard-wired circuitry used in place of, or in combination with software instructions. Thus, embodiments of the UWB signal modulator/injector 40 are not limited to any specific combination of hardware or software.

Referring to FIG. 3, the multiplicity of generated UWB pulses are sent from the service-provider UWB device 40 to the combiner 30, which combines the UWB pulses with the conventional RF carrier signals. One method to accomplish this task is to couple a wire carrying the conventional RF carrier signals to a standard coaxial splitter. A second wire carrying the UWB pulses is also coupled to the standard coaxial splitter. The combined signals are forwarded to the fiber optic transmitter/receiver 35. The fiber optic transmitter/receiver 35 converts both the multiplicity of UWB pulses and the conventional RF carrier signals received from the combiner 30 into a corresponding optical signal. The optical signal generator can be either a light-emitting diode, solid state laser diode, or other suitable device. The optical signal is then distributed on fiber optic cables to residential neighborhoods, business districts, universities, colleges or other locations for distribution to subscribers and customers. Other methods and techniques for combining a UWB pulse stream and a conventional RF carrier signal stream may also be employed. For example, the UWB pulse stream may be sent directly to the fiber optic transmitter/receiver 35, which will then combine the two signals.

Shown in FIG. 3, an access node 50 may be located at any one of the locations described above, such as a business district, residential neighborhood, or university district, or other suitable location. The access node 50 transfers the signals from the fiber optic cable to a coaxial cable that connects to individual offices, homes, or other locations. One or more line amps 55 may be located between the access node 50 and the individual locations, and may provide a tap location for additional coaxial cables and/or provide signal amplification.

The combined UWB and RF signals are then received at a customer location 60 that may, or may not, include a UWB demodulator 65. One feature of the present invention is that customer locations 60 can be individually upgraded without impacting other subscribers on the network. The UWB demodulator 65 may be considered a gateway or router that provides access to the combined UWB and RF signals.

One embodiment of the UWB demodulator 65 will demodulate the multiplicity of UWB electromagnetic pulses back into a conventional RF carrier signal. The UWB demodulator 65 may include all, some or additional components found in the service provider UWB signal modulator/injector 40. In this manner, additional bandwidth will be available to the wire media network to provide the additional data and functionality demanded by the customer.

Further details of UWB modulation techniques, and networks employing UWB technology are disclosed in U.S. patent application Ser. No. 10,188,987, titled: Ultra-Wideband Pulse Generation System and Method, which is referred to and incorporated herein in its entirety by this reference.

As defined herein, modulation is the addition of information to an electromagnetic signal. The present invention employs UWB pulse modulation to encode audio, video, or other data into a multiplicity of UWB pulses. Because UWB does not use a conventional carrier wave, the transmitted pulses, or waveforms themselves must contain the information being communicated. That is, the UWB pulses themselves contain the desired information.

For example, the UWB signal injector/modulator 40 may modulate the received audio, video, or other data signals into a multiplicity of UWB pulses that may have a duration that may range between about 0.1 nanoseconds to about 100 nanoseconds, and may be transmitted at relatively low power, for example, at less than −10 dB to −130 dB, as measured at a single frequency.

Modulation techniques cause a single symbol to represent a plurality of binary digits, or bits. This has the obvious advantage of increasing the data rate in a communications system. A few examples of modulation include Pulse Width Modulation (PWM), Pulse Amplitude Modulation (PAM), and Pulse Position Modulation (PPM). In PWM, a series of predefined widths are used to represent different sets of bits. For example, in a system employing 8 different pulse widths, each symbol could represent one of 8 combinations. This symbol would carry 3 bits of information. In PAM, predefined amplitudes are used to represent different sets of bits. A system employing PAM16 would have 16 predefined amplitudes. This system would be able to carry 4 bits of information per symbol. In a PPM system, predefined positions within the pulse timeslot are used to carry a set of bits. A system employing PPM16 would be capable of carrying 4 bits of information per symbol. Systems typically employ more than one technique. This has the potential of vastly increasing the data rate of a communications system.

A preferred embodiment modulation method of the present invention employs a set of different pulse emission, or transmission rates to represent different data groups. Put differently, a specific pulse transmission rate (PTR) represents a specific group of binary digits, or bits. In one embodiment, the UWB signal injector/modulator 40 transmits one or more electromagnetic pulses at a specific transmission rate, and the UWB demodulator 65 receives the electromagnetic pulses, determines the transmission rate and obtains an associated bit value from a look-up table, or other database.

Figure 4:
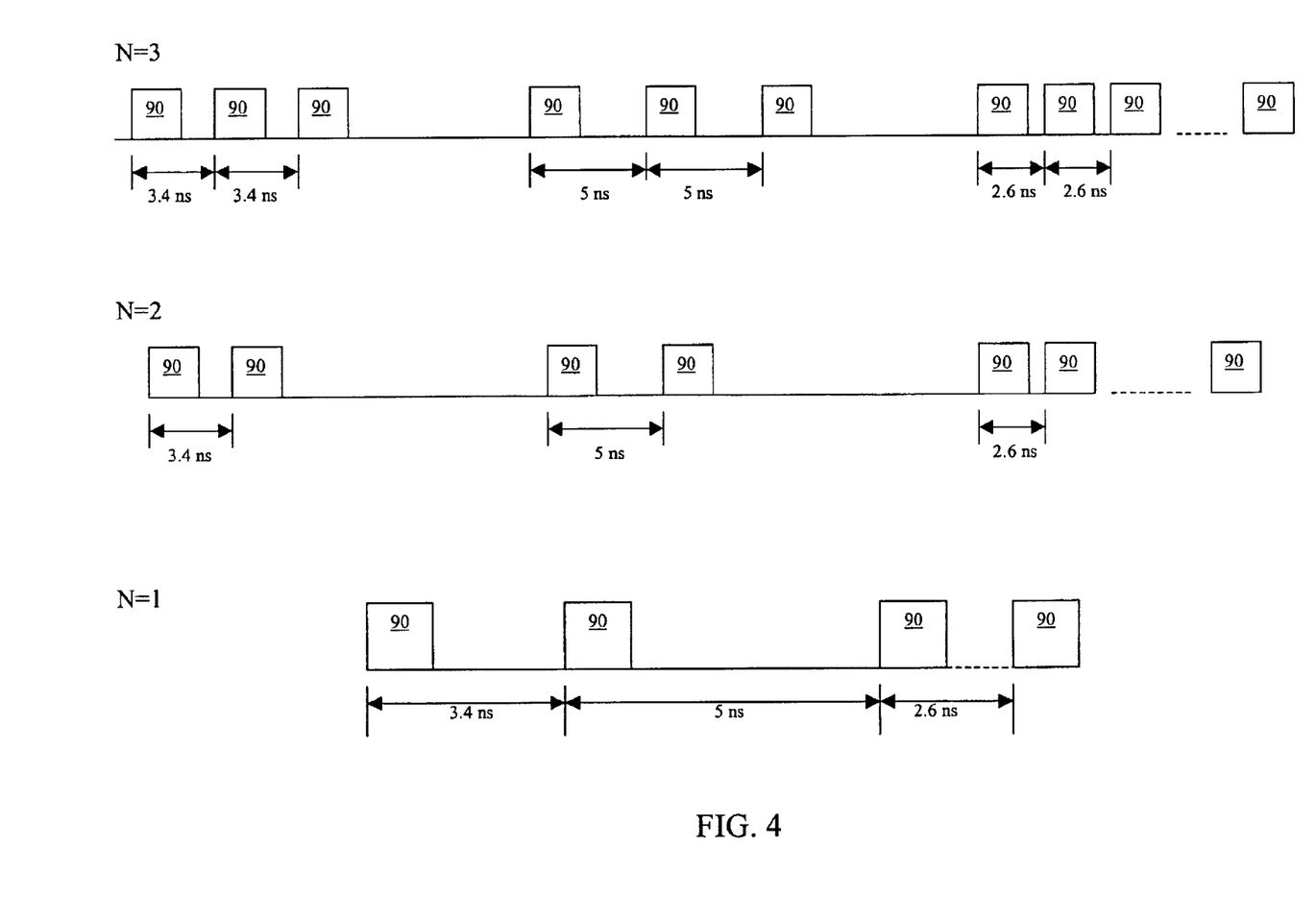
FIG. 4 is an illustration of ultra-wideband pulse groups transmitted at different pulse transmission rates according to one embodiment of the present invention.

For example, as illustrated in FIG. 4, a group of three ultra-wideband (UWB) electromagnetic pulses, or pulses 90 are transmitted 2.6 nanoseconds (ns) apart. 2.6 ns is equivalent to 384.6 million pulse cycles per second (MHz). Also shown in FIG. 4 is a group of pulses 90 transmitted at intervals of 5 ns, which is equivalent to 200.0 MHz, and a group of pulses 90 transmitted at 3.4 ns intervals, which is equivalent to 294.1 MHz.

The present invention is distinct from pulse position modulation in that PPM uses fixed time positions around a recurrence frequency to convey the information. The recurrence frequency can be either fixed or psudo-random. The specific time slot within the time frame defined by the recurrence frequency carries the data bits. The modulation technique disclosed in the present invention employs neither a fixed or psudo-random recurrence frequency. The recurrence frequency, or pulse transmission rate (PTR) employed at any instantaneous point in time is a representation of additional data bits. This has the advantage of providing additional bits per symbol to any pulsed communication system. Additionally in PPM the variation in pulse times is usually less than half of the width of the pulse. In the present invention, this variation and the resultant pulse duty cycle are variable. One set of pulses may have a variability of 20 ns, in the case of a 50 MHz PTR, another set may have a 5 ns separation for a 200 MHz PTR.

One feature of the present invention is that a group of pulses 90 may be transmitted at the same transmission rate to minimize a Bit Error Rate (BER). Illustrated in FIG. 4, a group of three pulses are transmitted at a consistent transmission rate, then a second group is transmitted at another transmission rate and then a third group is transmitted at yet another transmission rate. Thus, for the first group, the number of pulses (N) per group is equal to 3. For the second group, N=2, and for the third example, N=1. However, it will be appreciated that N can range anywhere from 1 to 10, as necessary to minimize the BER. The number of pulses (N) is employed in the preferred embodiment for the purposes of validation and error correction. There are numerous tradeoffs in the selection of N. A large N will reduce the overall data rate but allows for more robust error correction and increases data transmission reliability. Additionally, if N is large there is a possibility of generating spectral lines at the PTR and its integer multiple harmonics. Selection of a lower N allows for increased data rates, but reduces the redundancy of the system and may lead to higher Bit Error Rates.

In pulsed communications, the pulse-to-pulse interval can be varied on a pulse-by-pulse basis by two components: an information component and a pseudo-random code component. Generally, conventional frequency domain spread spectrum systems make use of pseudo-random codes to spread the normally narrow band information signal over a relatively wide band of carrier frequencies. A conventional spread spectrum receiver correlates these signals to retrieve the original information signal. In conventional spread spectrum systems, the pseudo-random code serves the purpose of spreading the signal energy throughout the available spectrum. In ultra-wideband communication systems, the psudo-random code is used for channelization, energy smoothing in the frequency domain, resistance to interference, and reducing the interference potential to nearby receivers.

In contrast, the present invention utilizes the PTR to encode additional data bits. The PTR is neither fixed nor psudo-random. The specific data being transmitted sets the PTR. Each PTR is associated to a distinct bit pattern or data group. When a set of pulses is received, the PRF is determined and associated with a predetermined data group. This modulation technique can be employed in conjunction with other pulsed techniques. The effect of N pulses transmitted at each PTR concentrates spectral energy at a given set of frequencies. This has the advantage of reducing the energy in the surrounding spectrum. The PTR is then hopped to a new frequency before the system suffers detrimental affects from the created spectral lines.

The maximum number of pulse 90 transmission rates is dependent on the ability to determine the pulse 90 arrival time. As shown below in TABLE 1, the time duration between each pulse 90 determines the pulse transmission rate. In the case where the lower pulse transmission rate is set to 200 MHz, the time duration of each pulse 90 is 5.0 nano-seconds (ns). With a 200 pico-second resolution in time the next available pulse transmission rate has a period of 4.8 ns. This corresponds to a pulse transmission rate approximately 208.3 MHz. The next available pulse transmission rate would have a period of 4.6 ns corresponding to approximately 217.4 MHz. Other pulse time resolutions may be employed, such as 300 pico-seconds, 100 pico-seconds, 50 pico-seconds, or other suitable time resolutions.

TABLE 1

| Time Period (sec) | Pulse Transmission Rate (MHz) |
|---|---|
| $5.00 \times 10^{-9}$ | 200.0 |
| $4.80 \times 10^{-9}$ | 208.3 |
| $4.60 \times 10^{-9}$ | 217.4 |
| $4.40 \times 10^{-9}$ | 227.3 |
| $4.20 \times 10^{-9}$ | 238.1 |
| $4.00 \times 10^{-9}$ | 250.0 |
| $3.80 \times 10^{-9}$ | 263.1 |
| $3.60 \times 10^{-9}$ | 277.8 |
| $3.40 \times 10^{-9}$ | 294.1 |
| $3.20 \times 10^{-9}$ | 312.5 |
| $3.00 \times 10^{-9}$ | 333.3 |
| $2.80 \times 10^{-9}$ | 357.1 |
| $2.60 \times 10^{-9}$ | 384.6 |
| $2.38 \times 10^{-9}$ | 420.1 |
| $2.18 \times 10^{-9}$ | 458.7 |
| $1.98 \times 10^{-9}$ | 505.1 |

At the lower pulse transmission rate (PTR) of 200 MHz the period of the signal is 5 nano-seconds. At the upper PTR of 505.1 MHz the period of the signal is approximately 1.9 nano-seconds. The difference in periods of the two pulse transmission rates is 3.1 nano-seconds. When employing a 200 picosecond time resolution, a communication system constructed according to the present invention utilizing a lower PTR of 200 MHz and an upper PTR of 525 MHz is capable of 16 distinct pulse transmission rates.

The data rate capacity of a communications system employing the pulse transmission rate method herein described is dependent on the pulse transmission rate and the number of bits transmitted per pulse 90. In a preferred embodiment of the invention, the pulse transmission rate is varied, and thus the data rate capacity is variable as well but can be calculated as the average capacity over time. One embodiment of the present invention transmits a pulse 90 that represents 4 bits. Other embodiments may transmit pulses that represent 6, 8, 16, 32 or 64 bits.

The capacity of a communications system employing the pulse transmission rate method herein described is also dependent on the number of pulses (N) sent at each PTR. When N is 1, the pulse transmission rate changes on a pulse-to-pulse basis. In this example there are 16 PTRs. The number of bits per symbol (B) is calculated as:

$$B = (1/N) \, LOG_2(P)$$

where P is the number of PTRs. Sixteen PTRs can carry 4 Bits per symbol when N=1. When N>1, the data rate decreases.

Line encoding is a method of ensuring that certain binary digit, or bit patterns are eliminated from a group of data. In 4B/5B line encoding, sets of 4 sequential zeros are eliminated from the data. This is accomplished by replacing sets of 4 bits with a set of 5 bits, as shown below in TABLE 2. This replacement ensures that a sequence of 4 successive zeros is never transmitted. However, the expense of 4B/5B is an additional 20% increase in the amount of data that must be transmitted. That is, for every 4 bits transmitted prior to the encoding, 5 bits must now be transmitted.

TABLE 2

| Data Input | Data Output |
|---|---|
| 0000 | 11110 |
| 0001 | 01001 |
| 0010 | 10100 |
| 0011 | 10101 |
| 0100 | 01010 |
| 0101 | 01011 |
| 0110 | 01110 |
| 0111 | 01111 |
| 1000 | 10010 |
| 1001 | 10011 |
| 1010 | 10110 |
| 1011 | 10111 |
| 1100 | 11010 |
| 1101 | 11011 |
| 1110 | 11100 |
| 1111 | 11101 |

4B/5B line encoding has the additional effect of shifting the probability of occurrence of data patterns. One feature of the present invention is the recognition of this aspect of 4B/5B encoding, and its advantageous use to increase data transmission rates. In a preferred method of the present invention, the bit sequence of four consecutive zeros (0000) was eliminated. It will be appreciated that any combination of four binary digits may be eliminated by 4B/5B line encoding. Moreover, other line encoding schemes may be employed, such as 2B/6B, or other line encoding methods.

Shown below in TABLE 3, is an incidence distribution of 4-bit data groups generated by a 10,000 pseudo-random bit sequence that was 4B/5B line encoded. The incidence distribution is obtained after the 5-bit groups resulting from the 4B/5B line encoding have been re-grouped into 4-bit groups. It can be seen that specific data groups have a higher incidence, for example, the 1101, 1011, and 1010 data groups each occur over 1,000 times.

TABLE 3

| Data Group | Incidence |
|---|---|
| 0000 | 0 |
| 0001 | 74 |
| 0010 | 452 |
| 0011 | 408 |
| 0100 | 496 |
| 0101 | 999 |
| 0110 | 522 |
| 0111 | 933 |
| 1000 | 74 |
| 1001 | 786 |
| 1010 | 1043 |
| 1011 | 1047 |
| 1100 | 365 |
| 1101 | 1090 |
| 1110 | 933 |
| 1111 | 778 |

One feature of the invention is that lower probability data groups are assigned to lower pulse transmission rates. Additionally, one bit sequence (0000) is eliminated from the data, which allowes 4 bits of information to be transmitted on 15 PTR's, instead of 16 PTR's that would normally be required. This increases the average data transmission rate because data transmission rates increase with higher pulse transmission rates. TABLE 4 shows one embodiment of the present invention where the higher probability data groups are assigned to higher pulse transmission rates.

TABLE 4

| Pulse Transmission Rate (MHz) | Assignment | Probability (%) |
|---|---|---|
| 200.0 | 0000 | 0.0000 |
| 208.3 | 0001 | 0.0074 |
| 217.4 | 1000 | 0.0074 |
| 227.3 | 1100 | 0.0365 |
| 238.1 | 0011 | 0.0408 |
| 250.0 | 0010 | 0.0452 |
| 263.1 | 0100 | 0.0496 |
| 277.8 | 0110 | 0.0522 |
| 294.1 | 1111 | 0.0778 |
| 312.5 | 1001 | 0.0786 |
| 333.3 | 0111 | 0.0933 |
| 357.1 | 1110 | 0.0933 |
| 384.6 | 0101 | 0.0999 |
| 420.1 | 1010 | 0.1043 |
| 458.7 | 1011 | 0.1047 |
| 505.1 | 1101 | 0.1090 |

Data transmission rate can be calculated as follows:

$$R = B * \sum_{i=1}^{P} Pr_i * PTR$$

where B is the number of bits per symbol, $Pr_i$ is the probability of symbol (or data group) occurrence, PTR is the pulse transmission rate associated with the specific data group, and P is the number of PTRs used. Without line encoding, all data groups are equally probable therefore $Pr_i$ is equal to 1/16 for all i. For example, without line encoding, the effective PTR is the mean of the PTR's used, or 294.1 MHz in the above example. With line encoding, the effective PTR, for the example shown in TABLE 4, is 357.19. In a preferred embodiment of the present invention, 16 PTRs are used, which allows 4 bits per N pulses. 32, 64, or 128 PTRs may also be employed. The effective PTR, as defined herein, is the weighted sum of the probability of symbol (or data group) occurrence times the PTR.

TABLE 5 shows the effect of 4B/5B line encoding and the number of pulses (N) on data rate. On feature of the present invention is that 4B/5B encoding (which increases the amount of data that must be transmitted by 20%) with the probability-based data group assigning method of the present invention (as shown above in TABLE 4) can transmit data at almost the same rate as data transmitted without 4B/5B encoding. As shown in TABLE 5, 4B/5B encoding with probability-based data group assigning produced a 17.7% increase in the PTR. This almost compensates for the increased amount of data (20%) that must be transmitted.

TABLE 5

| N | Bits per Symbol | Rate Without 4B/5B PTR = 294.1 | Rate With 4B/5B PTR = 357.2 |
|---|---|---|---|
| 1 | 4 | 1.1 Gbps | 1.1 Gbps |
| 2 | 2 | 588.2 Mbps | 571.5 Mbps |
| 3 | 1.3 | 382.3 Mbps | 381.0 Mbps |
| 4 | 1.0 | 294.1 Mbps | 285.8 Mbps |

Another example of the method of probability-based data group assigning of the present invention is shown in TABLE 6. In this embodiment, the PTR for a group of random data is shown in the first column. The data was then 4B/5B encoded, and the probability of occurrence of specific data groups was determined. A weighted sum of each data group when then obtained, as shown in the third column. As shown at the bottom of TABLE 6, the effective PTR for this group of data (which uses a wider range of PTRs than used in TABLE 4), when transmitted using probability-based data group assigning, is higher than the PTR for random data. Therefore, the probability-based data group assigning method of transmitting data can exceed the transmission rate of random data, while transmitting the additional 20% of data.

TABLE 6

| Pulse Transmission Rate (MHz) | Probability % | Weighted Sum |
|---|---|---|
| 100.2 | 0.00 | 0.0 |
| 106.1 | 0.0074 | 785,000 |
| 112.7 | 0.0074 | 833,700 |
| 120.1 | 0.0365 | 4,383,700 |
| 128.6 | 0.0408 | 5,246,700 |
| 138.4 | 0.0452 | 6,254,900 |
| 149.8 | 0.0496 | 7,429,200 |
| 163.2 | 0.0522 | 8,520,600 |
| 179.3 | 0.0778 | 13,951,800 |
| 198.9 | 0.0786 | 15,637,700 |
| 223.4 | 0.0933 | 20,843,000 |
| 254.7 | 0.0933 | 23,762,700 |
| 296.1 | 0.0999 | 29,588,400 |
| 353.8 | 0.1043 | 36,903,100 |
| 439.3 | 0.1047 | 45,995,300 |
| 579.3 | 0.109 | 63,140,200 |
| Effective PTR: 221.5 MHz | | 283.3 MHz |
| Data rate: 886 Mbps | | 906.5 Mbps |

Alternative embodiments of the present invention may be employed in wire media systems or networks where the available bandwidth is reduced, for example, to 450 MHz for some legacy and international television systems. In these systems, the specific PTRs would be selected to meet the parameters of each system.

Another feature of the present invention is that 4B/5B line encoding with probability-based data group assigning (one example of which is shown in TABLE 4) significantly suppresses power spectral density (PSD). In ultra-wideband communications systems that must coexist with other forms of communication on a wire media, a primary concern is the amplitude and shape of the power spectral density. Power spectral density shows how the power in a random process is distributed across frequency. That is, PSD shows the variation in a signal, and is a variance density function that describes how a signal energy or power is distributed across frequency. Mathematically, PSD is defined as the Fourier Transform of the autocorrelation sequence of the time series.

The power spectral density is one limiting factor to coexistence in a CATV system. The injection of a UWB pulse train into a CATV system raises the noise floor of the system. The television tuner sees this additional energy as noise. At various power levels the additional energy of the UWB pulses exceeds the sensitivity of the tuner.

Figure 5:
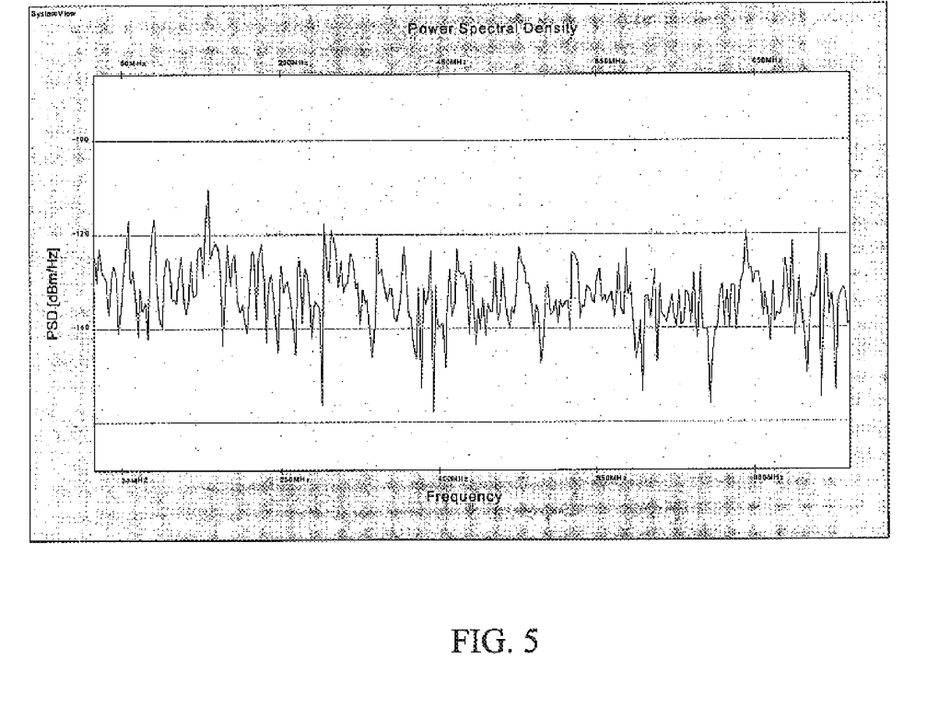
FIG. 5 is an illustration of the power spectral density of the ultra-wideband pulse groups of FIG. 4.

Preferably, the frequency content of the UWB pulses 90 should not interfere with the other signals transmitted through the wire. Illustrated in FIG. 5, the power spectral density of UWB pulses 90 transmitted according to the methods of the present invention generally do not exceed −100 dBm/Hz, and on average are −130 dBm/Hz. This low power spectral density allows the UWB pulses 90 to coexist with conventional CATV signals. This is because most television tuners have sensitivity down to −95 dBm. For the UWB pulse 90 to coexist in this environment without interference, the power level at the frequency band of interest should be preferably below −95 dBm. The present invention modifies the spectral density of the UWB signal in a way that has unexpected benefits. The transient presence of spectral lines concentrates energy at the PTR and its harmonics. This effectively reduces the energy in the surrounding spectrum. The selection of the number of pulses N sets the dwell time at any given PTR.

The time and frequency domains have an inversely supported relationship. A widely supported time domain signal will be narrowly supported in the frequency domain. The PSD of a UWB pulse 90 train that has a wider time separation between pulses will therefore have a narrow PSD. Since the UWB pulse 90 train has a finite amount of energy, the amplitude of the PSD is higher for a broader time separation at the same energy level. In communications systems that must coexist on one medium, this relationship must be considered in selecting both the minimum PTR and the number of pulses transmitted at each PTR. If the number of pulses transmitted at each PTR is low, the effect of a higher amplitude PSD will be reduced since the energy is only transmitted at that PTR for a brief time.

One feature of the present invention is that the generally random nature of the data groups will dither the PTR. In the preferred embodiment of the present invention a plurality of pulses is transmitted at any PTR the media can support. For example, in the cable television environment, the upstream data traffic typically resides below 50 MHz. Generally, a CATV system may occupy a frequency range from below 50 MHz up to 997 MHz. This allows a variable PTR to be supported from below 50 MHz up to, and beyond, 997 MHz. Since the information is carried in the time domain, use of PTRs below 50 MHz is possible for downstream traffic as well.

Another embodiment pulse modulation method of the present invention comprises a linear FM chirp applied to the PTR. The data is carried by the chirp rate of the system. In this embodiment, a plurality of pulses N is transmitted, and the PTR of these N pulses is linearly increased by a multiplying factor. Each multiplying factor represents a different pre-determined set of bits. In this embodiment the base PTR can be fixed and the subsequent N-1 pulses may be used to set the chirp rate.

A further embodiment of the present invention combines the techniques of N pulses at a given PTR to represent a set of bits. The time period from the set of N to the first of the next set of N sets the PTR for the upcoming set. Within the next set of N pulses, chirp modulation, and if appropriate, amplitude modulation may carry additional data. In this embodiment, the transmission rate capacity may approach a PTR-only modulation with N =1.

Figure 6:
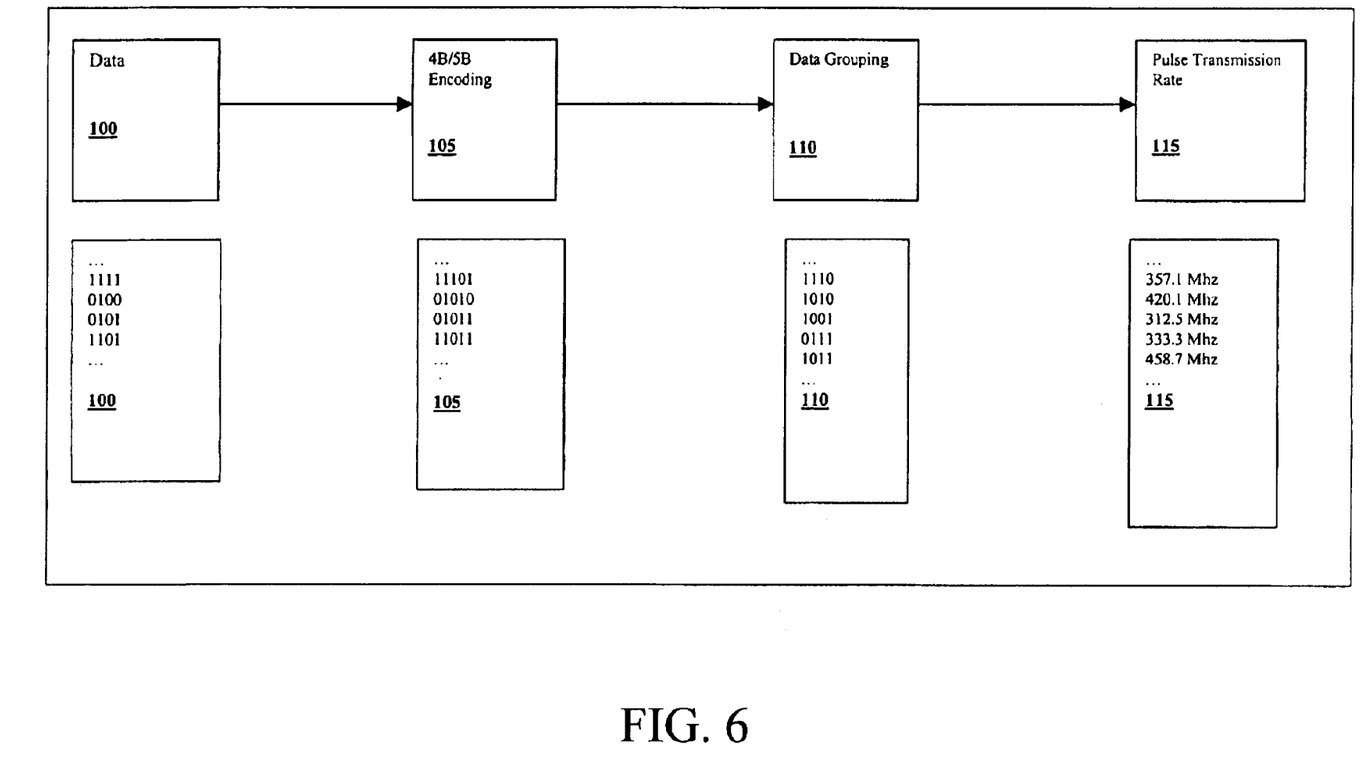
FIG. 6 is a illustration of one method of the present invention for obtaining, encoding, grouping and transmitting data.

Referring to FIG. 6, one method of transmitting data according to the present invention is illustrated. First, in step 100, data is obtained for transmission. This data can consist of voice, audio, video, or any other type of data. Next, in step 105, the data is line encoded using 4B/5B methods. Next, in step 110, the line encoded data is regrouped into 4-bit groups. Finally, in step 115, a corresponding pulse transmission rate is determined for each 4-bit data group. It will be appreciated that the data transmission method shown in FIG. 6 can be modified by using different line encoding methods, or by grouping the data into different sized bit groups. Once the pulse transmission rate is determined, N pulses 90 are then transmitted at the determined pulse transmission rate. For example, as shown in FIG. 6, a group of N pulses 90 would be transmitted at a pulse transmission rate of 357.1 MHz, with a second group of N pulses 90 transmitted at 420.1 MHz, and so forth.

In the embodiment of the present invention shown in FIG. 3, the multiplicity of transmitted UWB pulses 90 are received by a UWB demodulator 65. The UWB demodulator then determines the pulse transmission rate and obtains a 4-bit data group that corresponds to the pulse transmission rate. An inverse of the 4B/5B line encoding is applied to the data group and the data is recovered. In this fashion, UWB pulses 90 can coexist with conventional signals transmitted simultaneously on a wire media. Alternative embodiments of the present invention may also be transmitted wirelessly as part of a wireless PAN, LAN, or WAN network. "Upstream" is the term used for a signal, or pulse that is transmitted from the customers' premises to the head-end 12. Referring to FIG. 3, a customer may, for example, request a pay-per-view movie for viewing on the television 75. This request may be processed by the UWB demodulator 65 and sent back to the head-end 12. The frequency range available for upstream communications is between about 5 MHz and 42 MHz. However, the most preferred bands in use are either 20–26 MHz or 28–34 MHz. It will be appreciated that different communication systems may employ different frequency ranges for upstream communications.

Conventional hybrid fiber-coaxial CATV networks employ band-pass filters to ensure the integrity of downstream traffic from interference from the upstream communications traffic. These band-pass filters will also isolate any upstream UWB pulses 90 from downstream communications traffic. One embodiment of the present invention may employ pulse amplitude modulation (PAM) as well as the pulse transmission rate (PTR) modulation discussed above for upstream communications in a wire network, or in a wireless network.

One embodiment of the present invention may be employed in a CATV network where the upstream communications are limited to approximately 50 MHz. In this type of CATV network, the pulse transmission rate (PTR) for the upstream UWB pulses 90 would be 20 nano-seconds. With a minimum PTR of 12.2 MHz and a maximum PTR of 45 MHz, the PTR pulse modulation method of the present invention would be capable of supporting 4 PTRs. In this embodiment, the PTRs would be 45.0 MHz, 23.7 MHz, 16.1 MHz, and 12.2 MHz.

As discussed above, with the addition of band-stop filters PAM can be additionally utilized in the upstream. TABLE 7 shows the data rates for PTR pulse modulation with two different levels of PAM (4-PAM and 8-PAM). Other levels of PAM, such as 16-PAM, 32-PAM or 64-PAM may also be employed.

TABLE 7

| PTRN | Without PAM | With 4-PAM | With 8-PAM |
|---|---|---|---|
| N = 1 | 48.4 Mbps | 96.8 Mbps | 121.0 Mbps |
| N = 2 | 24.2 Mbps | 48.4 Mbps | 60.5 Mbps |
| N = 3 | 16.1 Mbps | 32.3 Mbps | 40.3 Mbps |

One feature of the present invention is it can be employed in an environment where other pulse modulation techniques are dramatically limited by material or atmospheric conditions. The amplitude, phase and pulse width are not relevant. In systems with significant ringing effects, pulse amplitude modulation is problematic. The oscillation from previous pulses can interfere with the amplitude of subsequent pulses. The present invention relies only on the accurate detection of the UWB pulse 90.

Thus, it is seen that an apparatus and method of modulating, transmitting and receiving electromagnetic pulses, such as ultra-wideband pulses, is provided. One skilled in the art will appreciate that the present invention can be practiced by other than the above-described embodiments, which are presented in this description for purposes of illustration and not of limitation. The description and examples set forth in this specification and associated drawings only set forth preferred embodiment(s) of the present invention. The specification and drawings are not intended to limit the exclusionary scope of this patent document. Many designs other than the above-described embodiments will fall within the literal and/or legal scope of the following claims, and the present invention is limited only by the claims that follow. It is noted that various equivalents for the particular embodiments discussed in this description may practice the invention as well.

What is claimed is:

1. A method of communicating data, the method comprising the steps of:
   transmitting a plurality of electromagnetic pulses, wherein a time period between N pulses is variable;
   receiving the plurality of pulses;
   determining the time period between each pulse; and
   assigning a data value to N pulses based on the time period between N pulses.

2. The method of claim 1, wherein the time period between each pulse can range from about 50 pico-seconds to about 10 nano-seconds.

3. The method of claim 1, wherein N pulses can range from 1 pulse to 10 pulses.

4. The method of claim 1, wherein the assigned data value is a group of bits selected from a group consisting of: a 4-bit group, a 6-bit group, a 8-bit group, a 16-bit group, a 32-bit group, a 64-bit group and a 128-bit group.

5. The method of claim 1, wherein the electromagnetic pulse is selected from a group consisting of: ultra-wideband pulses and impulse radio pulses.

6. The method of claim 1, wherein the time period between each pulse is determined by a dispersion characteristic of a transmission media.

7. The method of claim 6, wherein the transmission media is selected from a group consisting of: air, an optical fiber ribbon, a fiber optic cable, a single mode fiber optic cable, a multi mode fiber optic cable, a twisted pair wire, an unshielded twisted pair wire, a plenum wire, a PVC wire, a coaxial cable, and an electrically conductive material.

8. The method of claim 1, wherein a minimum pulse transmission rate is determined by the steps of:
   obtaining a power spectral density of the transmitted pulses;
   increasing the pulse transmission rate until the power spectral density attains a predetermined level.

9. The method of claim 8, wherein the predetermined level of the power spectral density can range between about −40 dBm to about −150 dBm.

10. The method of claim 1, wherein the plurality of electromagnetic pulses transmit data selected from a group consisting of: telephony data, high-speed data, video data, television data, Internet communication data and audio data.

11. The method of claim 1, wherein the data is communicated through a wire network that is selected from a group consisting of: a power line, an optical network, a cable television network, a community antenna television network, a community access television network, a hybrid fiber coax system network, a public switched telephone network, a wide area network, a local area network, a metropolitan area network, a TCP/IP network, a dial-up network, a switched network, a dedicated network, a non-switched network, a public network and a private network.

12. The method of claim 11, wherein the data is communicated substantially simultaneously with a wire network communication signal.

13. The method of claim 1, wherein the step of transmitting a plurality of electromagnetic pulses includes varying the time period between N pulses and varying a pulse amplitude of N pulses.

14. A method of communicating data, the method comprising the steps of:
   means for transmitting a plurality of electromagnetic pulses, wherein a time period between N pulses is variable;
   means for receiving the plurality of pulses;
   means for determining the time period between each pulse; and
   means for assigning a data value to N pulses based on the time period between N pulses.

15. A computer program product for directing a general purpose digital computer to perform a desired function comprising:
   a set of computer readable instructions to transmit a plurality of electromagnetic pulses, wherein a time period between each pulse is variable;
   a set of computer readable instructions to receive the plurality of pulses;
   a set of computer readable instructions to determine the time period between each pulse; and
   a set of computer readable instructions to assign a data value to N pulses based on the time period between each pulse.

16. The computer program product of claim 15, wherein the time period between each pulse can range from about 50 pico-seconds to about 10 nano-seconds.

17. The computer program product of claim 15, wherein N pulses can range from 1 pulse to 10 pulses.

18. The computer program product of claim 15, wherein the assigned data value is a group of bits selected from a group consisting of: a 4-bit group, a 6-bit group, a 8-bit group, a 16-bit group, a 32-bit group, a 64-bit group and a 128-bit group.

19. The computer program product of claim 15, wherein the electromagnetic pulse is selected from a group consisting of: ultra-wideband pulses and impulse radio pulses.

20. The computer program product of claim 15, wherein the time period between each pulse is determined by a dispersion characteristic of a transmission media.

21. The computer program product of claim 15, wherein the transmission media is selected from a group consisting of: air, an optical fiber ribbon, a fiber optic cable, a single mode fiber optic cable, a multi mode fiber optic cable, a twisted pair wire, an unshielded twisted pair wire, a plenum wire, a PVC wire, a coaxial cable, and an electrically conductive material.

22. The computer program product of claim 15, wherein a minimum pulse transmission rate is determined by the steps of:

obtaining a power spectral density of the transmitted pulses;

increasing the pulse transmission rate until the power spectral density attains a predetermined level.

* * * * *